United States Patent
Kawamura et al.

(10) Patent No.: US 7,849,593 B2
(45) Date of Patent: Dec. 14, 2010

(54) METHOD OF MAKING MULTI-LAYER CIRCUIT BOARD

(75) Inventors: Koichi Kawamura, Kanagawa (JP); Takeyoshi Kano, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 466 days.

(21) Appl. No.: 11/628,478

(22) PCT Filed: May 31, 2005

(86) PCT No.: PCT/JP2005/009915

§ 371 (c)(1),
(2), (4) Date: Oct. 29, 2007

(87) PCT Pub. No.: WO2005/120142

PCT Pub. Date: Dec. 15, 2005

(65) Prior Publication Data

US 2008/0029294 A1    Feb. 7, 2008

(30) Foreign Application Priority Data

Jun. 1, 2004   (JP) .............................. 2004-163784

(51) Int. Cl.
*H05K 3/02* (2006.01)
(52) U.S. Cl. .............................. 29/846; 29/825; 29/852; 427/96.1
(58) Field of Classification Search ............. 29/825, 29/846, 852; 428/209; 427/96.1
See application file for complete search history.

(56) References Cited

U.S. PATENT DOCUMENTS

| | | |
|---|---|---|
| 5,648,201 A | 7/1997 | Dulcey et al. |
| 7,288,287 B2 * | 10/2007 | Tanaka et al. ............... 427/304 |
| 2002/0102745 A1 | 8/2002 | Lahiri et al. |
| 2003/0068581 A1 | 4/2003 | Kawamura et al. |
| 2004/0112634 A1 | 6/2004 | Tanaka et al. |
| 2005/0175824 A1 * | 8/2005 | Wakizawa et al. ........... 428/209 |

FOREIGN PATENT DOCUMENTS

| | | |
|---|---|---|
| EP | 1 371 754 A1 | 12/2003 |
| JP | 2001-509213 A | 7/2001 |
| JP | 2003-114525 A | 4/2003 |
| JP | 2003-188498 A | 7/2003 |
| JP | 2004-056106 A | 2/2004 |
| WO | 9834446 A | 8/1998 |
| WO | 2005/053368 A1 | 6/2005 |

OTHER PUBLICATIONS

European Search Report issued in European Application No. EP 05 74 5977 dated Sep. 24, 2010.

* cited by examiner

*Primary Examiner*—C. J Arbes
(74) *Attorney, Agent, or Firm*—Sughrue Mion, PLLC

(57) ABSTRACT

The invention provides a multi-layer circuit board sequentially having an insulating substrate, a first electrically conductive pattern arbitrarily formed, an insulating material layer and a second electrically conductive pattern formed by providing an electrically conductive material on a graft polymer pattern formed on the insulating material layer, and having an electrically conductive path which electrically connects the first electrically conductive pattern present on the insulating substrate and the second electrically conductive pattern. The graft polymer pattern includes a combination of a region where a graft polymer is present and a region where no graft polymer is present, or a combination of a region where a hydrophilic graft polymer is present and a region where a hydrophobic graft polymer is present.

8 Claims, 1 Drawing Sheet

METHOD OF MAKING MULTI-LAYER CIRCUIT BOARD

TECHNICAL FIELD

The present invention relates to a multi-layer circuit board, which is used in electric or electronic devices, and to a method for producing the same. More particularly, the present invention relates to a method for producing a high-density printed multi-layer circuit board in accordance with a semi-additive process and to a build-up multi-layer printed circuit board produced by the method.

BACKGROUND ART

Printed circuit boards having circuits formed on the surface of their insulating substrates are widely used in electronic parts and semiconductor devices. With recent demands for miniaturization and higher functions in electronic equipment, the printed circuit boards are required to have denser circuits and to be thinner. Establishment of a method for forming a fine circuit with a width of each line of 25 μm and a width of each space of 25 μm or lower is a particularly important task in the printed circuit board field.

As a method for producing a highly precise printed circuit board which method realizes such a fine circuit, a method called "a semi-additive method" has been proposed.

In this method, a plating catalyst such as a palladium compound is first applied to the surface of an insulating substrate made of a polymer material. Thereafter, electroless copper plating is conducted while the plating catalyst is used as a nucleus, whereby a thin copper plating film is formed on the entire surface of the insulating substrate.

Then, a photosensitive resist film (photoresist film) is applied to the surface of the thin copper layer formed by the electroless copper plating. A circuit pattern is transferred onto the resist film, and then development is carried out. Thus, a certain portion of the resist film where a circuit is to be formed is removed. Electro-copper plating is then conducted while the exposed, patterned portion of the thin copper layer is used as a power supply electrode. Thus, a copper plating film having a circuit pattern shape is formed on the surface of the thin copper layer.

Thereafter, the resist film is removed and then the thin copper layer formed by the electroless plating is removed by etching. Thus, a circuit pattern is formed. Furthermore, nickel plating or gold plating may, if desired, be conducted on the surface of the circuit pattern (the pattern formed by electro-copper plating) to produce a printed circuit board.

In the semi-additive method, a circuit pattern is formed at a circuit pitch corresponding to the resolution of a photosensitive resist film, namely development accuracy. It, therefore, enables precise formation of a finer circuit pattern than a method called "a subtractive method," where a circuit pattern is formed by etching a thick metal foil.

However, in the semi-additive process, there is a thin copper layer formed by electroless plating between an insulating substrate and a circuit pattern. This layer, however, inherently exhibits no adhesion to the insulating substrate. Therefore, when the surface of the insulating substrate has a relatively high degree of unevenness, the adhesion between the circuit pattern and the insulating substrate is well maintained by the anchor effect of the thin copper layer. However, when the insulating substrate has a smooth surface, the adhesion is insufficient and the adhesion strength of the resulting circuit to the substrate is insufficient.

The surface of the insulating substrate is roughened for the purpose of improvement in the adhesion strength of a circuit. The surface is usually provided with unevenness having a ten-point mean roughness (Rz value), measured on the basis of JIS B0601, of approximately 3 to 5 μm. The unevenness on the surface of the insulating substrate is unlikely to cause big problems if a width of each line of the circuit to be formed is 30 μm and a width of each space of the circuit is 30 μm or more. However, when a finer pattern, for example, a circuit pattern with a width of each line 25 μm and a width of each space of 25 μm or less, is to be formed, formation of highly dense, extremely thin circuit lines is influenced by unevenness of the surface of the insulating substrate, and thus the unevenness is a serious problem.

Therefore, in forming highly precise circuit patterns such as those having a width of each line of 25 μm and a width of each space of 25 μm or less, there is a great demand for a circuit formation technique which does not cause reduction in adhesion even in the case of an insulating substrate with a high surface smoothness, for example, an insulating substrate having, as a degree of smoothness, an Rz value of 3 μm or less, and preferably 1 μm or less.

Moreover, in the semi-additive method, a thin copper layer formed by electroless plating, which layer is ultimately unnecessary, must be removed in an etching process. In the course of removal of the thin copper layer by etching, the width and the thickness of the circuit pattern composed of a copper layer formed by electoplating also decrease due to the influence of the etchant. Therefore, it is difficult to produce an accurate circuit pattern with good reproducibility. This tendency becomes more remarkable with reduction in the width and the thickness of the circuit line.

Furthermore, in the semi-additive method, a plating catalyst used in the electroless copper plating step tends to remain on the surface of the insulating substrate. Therefore, the insulating property of the resulting printed circuit board is easily lowered. In addition, when the circuit pattern is subjected to nickel plating or gold plating, which is conducted as needed after the copper plating step, nickel or gold is deposited on the surface of the insulating substrate, so that there is a possibility that an undesired circuit may be formed. Use of an etchant having a high etching ability is a conceivable solution for removing the remaining plating catalyst. However, there is a problem in that the etchant causes deterioration in reproducibility of a circuit pattern in such a case. Thus, there is a need for a method for producing a highly accurate circuit pattern with good reproducibility.

DISCLOSURE OF INVENTION

Problems to be Solved by the Invention

Thus, there is a need for a multi-layer circuit board in which a fine wiring is formed on a smooth insulating substrate with a high adhesion strength. In addition, there is a need for a method for producing a multi-layer circuit board which method requires no etching process and which method can form a fine wiring on a smooth insulating substrate with a good adhesion strength.

Means for Solving the Problems

Through intensive studies, the inventors found that it is possible to meet the aforementioned needs by locally adhering an electrically conductive material utilizing the change in surface polarity, which corresponds to a graft polymer pattern, in the course of the formation of a multi-layer circuit, and completed the present invention.

A first aspect of the invention provides a multi-layer circuit board sequentially having an insulating substrate, a first electrically conductive pattern arbitrarily formed, an insulating material layer, and a second electrically conductive pattern formed by providing an electrically conductive material on a graft polymer pattern formed on the insulating material layer, and having an electrically conductive path which electrically connects the first electrically conductive pattern present on the insulating substrate and the second electrically conductive pattern.

Here, the graft polymer pattern formed on the insulating material layer may be a pattern having a region where a graft polymer is present and a region where no graft polymer is present, or a pattern having a region where a hydrophilic graft polymer is present and a region where a hydrophobic graft polymer is present. It is preferable to provide an electrically conductive material selectively in either of the regions in accordance with the embodiment.

A second aspect of the invention provides a method for producing a multi-layer circuit board, the method comprising (a) a step of forming a graft polymer pattern on an insulating material layer of a laminate, the laminate having a first electrically conductive pattern which is arbitrarily formed on an insulating substrate and the insulating material layer, (b) a step of forming, in a pattern, a second electrically conductive pattern corresponding to the graft polymer pattern, (c) a step of forming a hole in the insulating material layer, and (d) a step of introducing an electrically conductive material into the hole so as to impart electric conductivity and so as to form an electrically conductive path which electrically connects the second electrically conductive pattern and the first electrically conductive pattern.

In the above-mentioned method as well, the graft polymer pattern formed on the insulating material layer in step (a) may be a pattern having a region where a graft polymer is present and a region where no graft polymer is present, or a pattern having a region where a hydrophilic graft polymer is present and a region where a hydrophobic graft polymer is present.

The insulating substrate for use in the method for producing a multi-layer circuit board of the invention preferably has a mean roughness (Rz), as measured by a ten-point mean height method in accordance with JIS B0601 (1994), of 3 μm or less. According to the method of the invention, it is possible to form a highly accurate circuit lines (circuit) which exhibits excellent adhesion even to such a smooth substrate.

Effects of the Invention

According to the invention, it is possible to provide a multi-layer circuit board having, on a smooth insulating substrate, a very fine wiring excellent in adhesion. Moreover, by the method of the invention, it is possible to produce a multi-layer circuit board having, on a smooth insulating substrate, a very fine wiring, which exhibits excellent adhesion to the substrate without conducting an etching process. A multi-layer circuit board obtained by use of the method of the invention has an advantage of being excellent in reproducibility of very fine wirings because undesirable loss of insulating properties caused by the presence of residual plating catalysts and damage to circuits caused by an etching step, which occur in conventional methods, are prevented.

BEST MODE FOR CARRYING OUT THE INVENTION

The multi-layer circuit board of the invention will be explained in detail below together with the production method thereof.

The multi-layer circuit board of the invention has an electrically conductive path electrically connecting a first electrically conductive pattern present on an insulating substrate and a second electrically conductive pattern formed on an insulating material layer present on the first electrically conductive pattern, and the second electrically conductive pattern is formed corresponding to a graft polymer pattern.

In producing such a multi-layer circuit board, a laminate having an arbitrary electrically conductive pattern (first electrically conductive pattern) on an insulating substrate is prepared first. The first electrically conductive pattern may be formed by any method. The first electrically conductive pattern may be formed by a known method or may be formed by using a graft polymer pattern similarly to the formation of the second electrically conductive pattern, which will be described later.

In step (a) in the invention, a laminate having an insulating material layer on the first electrically conductive pattern formed arbitrarily on the insulating substrate is prepared and a graft polymer pattern is formed on the insulating material layer. Thereafter, (b) a step of forming, in a pattern, a second electrically conductive pattern corresponding to the graft polymer pattern, (c) a step of forming a hole in the insulating material layer and (d) a step of introducing an electrically conductive material into the hole to obtain electric conductivity, thereby forming an electrically conductive path which electrically connects the second electrically conductive pattern and the first electrically conductive pattern, are conducted. These steps, however, are not required to be carried out in the order of (a), (b), (c), and (d). Step (c) may be carried out prior to step (b) in some cases. Alternatively, those steps may be conducted in some other orders.

According to the method of the invention, the second electrically conductive pattern formed on the insulating material layer is chemically connected to the insulating material layer via the graft polymer pattern which has strong adhesion to the insulating material layer. Therefore, the adhesion strength between the insulating material layer and the second electrically conductive pattern is strong enough for practical use even if the insulating substrate or the insulating material layer disposed thereon is highly smooth.

The method for forming an electrically conductive pattern in the invention is a simple process because it does not need a pattern formation process using a photoresist, which pattern formation process is essential to the electrically conductive pattern formation process conducted in a conventional subtractive or semi-additive method. This shows a significantly large effect in the production of multi-layer circuit boards, which requires repetition of a process for forming a circuit as in the invention.

In order to clarify characteristics of the process of this method, the process is shown in comparison with conventional methods. In the method of the invention, a basic process includes seven steps, which are less than the number of the steps in other conventional processes shown below, and thus being superior in production simplicity. The process shown below is description of one embodiment, and should not be construed as limiting the invention.

[Electrically Conductive Pattern Formation Process According to the Subtractive Method]
1. Insulating substrate→2. Holing (via hole formation)→3. Desmutting, surface roughening→4. Electroless treatment→5. Electroplating→6. Resist application→7. Exposure→8. Development→9. Etching→10. Resist removal→11. Quick etching

[Electrically Conductive Pattern Formation Process According to the Semi-Additive Method]
1. Insulating substrate→2. Holing (via hole formation)→3. Desmutting, surface roughening→4. Electroless treatment→5. Resist application→6. Exposure→7. Development→8. Electroplating→9. Resist removal→10. Quick etching

[Electrically Conductive Pattern Formation Process According to a Method of the Invention (One Embodiment)]
1. Insulating substrate→2. Holing (via hole formation)→3. Application of polymerizable group-containing compound→4. Exposure→5. Development→6. Electroless plating treatment (electrically conductive material adhesion treatment)→7. Electroplating Hereinafter, each of steps (a)-(d) of the invention will be described below.

(a) Step of Forming Graft Polymer Pattern on Insulating Material Layer

A graft polymer pattern formed on an insulating substrate or an insulating material layer formed on a substrate (hereinafter, one or both of the insulating substrate and the insulating material layer are called "substrate" in some cases) includes two types of pattern: pattern (a-1) including a region where a graft polymer is present and a region where no graft polymer is present and formed by forming the graft polymer in a pattern on the surface of the substrate or by forming the graft polymer on the entire surface of the substrate and decomposing, in a pattern, a part of the graft polymer, and pattern (a-2) including hydrophilic region/hydrophobic region of a graft polymer formed by forming the graft polymer on the entire surface of the substrate and changing the hydrophilicity/hydrophobicity of the graft polymer in a pattern.

First, (a-1) a method of forming a graft polymer in a pattern on a substrate surface to form a region where the graft polymer is present and a region where no graft polymer is present, will be explained.

One embodiment of this graft polymer pattern formation includes bringing a polymerizable group-containing compound into contact with the substrate surface and imagewise irradiating radiation to form a graft polymer pattern only in the irradiated region. The mechanism of the graft polymer pattern formation is as follows. The radiation irradiation generates, on the substrate surface, active points such as radicals, at which radical polymerization starts to form a graft polymer on the substrate surface.

In order that the radiation irradiation generates radicals on the substrate surface, various known methods may be employed. Examples thereof include: a method in which high-energy radiation such as electron beams is used as the radiation to cut covalent bonds of a polymer that constitutes the substrate surface, thereby generating radicals; a method in which a radical generating agent that generates a radical is included in a substrate layer and is optically decomposed to generate radicals; and a method in which a polymerizable compound to be brought into contact with a substrate surface contains a small amount of a compound such as benzophenone, and light causes benzophenone to pull hydrogen atoms from the substrate to generate radicals on the substrate. In addition, a graft polymer pattern can also be formed by fixing a photoradical generating agent at a substrate surface, bringing a monomer into contact with the surface, and irradiating light in a pattern.

These methods can be any known methods disclosed in literature. For example, in Shin Kobunshi Jikkengaku 10 (Experimental Polymer Science, New Edition, volume 10), p. 135 (edited by The Society of Polymer Science, Japan, and published by Kyoritsu Shuppan Co., Ltd. (1994)), a photograft polymerization method and a plasma irradiation graft polymerization method are disclosed as methods of surface graft polymerization. Further, methods of effecting graft polymerization by irradiating radiation, such as γ-rays and electron beams, are described in Kyuchaku Gijutu Binran (Handbook of Adsorption Technology), pages 203 and 695, compiled under the supervision by Prof Takeuchi, and published by NTS Co., in February 1999. As specific methods of the photo-graft polymerization, methods disclosed in Japanese Patent Application Laid-Open (JP-A) Nos. 63-92658, 10-296895 and 11-119413 may be employed.

Another method may be one in which a radical generating agent is bonded, in a pattern, to a substrate surface and is used as an initiation site to form a graft polymer in the pattern. Examples of the method for bonding a radical generating agent to the substrate surface in a pattern include the following two methods. One is a method in which a radical generating agent contained in the substrate layer or fixed on the entire surface of the substrate is decomposed in a pattern by light irradiation. The other is a method in which a radical generating agent is bonded to the substrate in a pattern by using a micro-contact printing method. In the latter method, the radical generating agent is first attached to the surface of a stamp made of a polydimethylsiloxane polymer and is then transferred to the surface of the substrate. Thus, a pattern of the radical generating agent is formed on the surface of the substrate. After the pattern of the radical generating agent is formed on the surface, a monomer is brought into contact with the surface of the substrate and the entire surface of the substrate is irradiated with light. Thereby, graft polymerization can be started while the radical generating agent serves as starting points.

The polymerizable group-containing compound for use in the graft polymer pattern formation may be any of a monomer, a macromer or a macromolecular compound having a double bond. Any conventional compounds of these types may be used. Among them, a particularly useful compound in the invention is a compound which has both a polymerizable group and a functional group capable of interacting with the electrically conductive material. Examples of the functional group capable of interacting with an electrically conductive material include hydrophilic groups such as a carboxyl group, a hydroxyl group, an amino group, a sulfonate group, a phosphonate group and an amido group; and hydrophobic groups such as heterocyclic groups containing a nitrogen or sulfur atom, aromatic groups and long-chain alkyl groups.

Specific examples of the monomer include (meth)acrylic acid and alkali metal salts and amine salts thereof, itaconic acid and alkali metal salts and amine salts thereof, styrenesulfonic acid and alkali metal salts and amine salts thereof, 2-sulfoethyl(meth)acrylate and alkali metal salts and amine salts thereof, 2-acrylamido-2-methylpropanesulfonic acid and alkali metal salts and amine salts thereof, acid phosphoxypolyoxyethylene glycol mono(meth)acrylate and alkali metal salts and amine salts thereof, polyoxyethylene glycol mono(meth)acrylate, 2-hydroxyethyl(meth)acrylate, (meth)acrylamide, N-monomethylol(meth)acrylamide, N-dimethylol(meth)acrylamide, allylamine and hydrohalogenic acid salts thereof, N-vinylpyrrolidone, vinylimidazole, vinylpyridine, vinylthiophene, styrene, and (meth)acrylic esters having an alkyl group with 1-24 carbon atoms such as ethyl(meth)acrylate and n-butyl(meth)acrylate.

The macromers may be prepared from these monomers in conventional methods. As a method for producing a macromonomer for use in this embodiment, various methods were proposed, for example, in "Chemistry and Industry of Macromonomers," edited by Yuya Yamashita, published by IPC, Sep. 20, 1989, Chapter 2 "Synthesis of Macromonomers." The molecular weight of the macromonomer is preferably within the range of from 250 to 100,000, and more preferably within the range of from 400 to 30,000.

The macromolecular compound having a double bond refers to a polymer having an ethylene-addition-polymerizable unsaturated group (polymerizable group), such as a vinyl group, an allyl group or a (meth)acrylic group. This type of polymer has the polymerizable group at least at its end or in its side chain. The macromolecular compound having a double bond preferably has the above-mentioned functional group capable of interacting with the electrically conductive material, such as a carboxyl group, in addition to the polymerizable group. Examples of a method for preparing such a macromolecular compound having a double bond include a method in which a monomer having an interactable group is copolymerized with a monomer having a polymerizable group; a method in which a monomer having an interactable group is copolymerized with a monomer having a double bond precursor and a double bond is introduced thereto, for example, by treatment with a base; and a method in which a polymer having an interactable group is reacted with a monomer having a polymerizable group.

From the viewpoint of synthesizability, preferred are the method in which a polymer having an interactable group is reacted with a monomer having a polymerizable group to introduce the polymerizable group and the method in which a monomer having an interactable group is copolymerized with a monomer having a double bond precursor and a double bond is introduced thereto, for example, by treatment with a base.

Next, (a-2) a method for forming a graft polymer on the entire surface of the substrate and changing the hydrophilicity/hydrophobicity of the graft polymer in a pattern to form a hydrophilic region and a hydrophobic region of the graft polymer will be explained.

This method includes: forming a graft polymer of a monomer such as t-butyl acrylate on the entire surface of a substrate, generating acid by light or heat, structurally changing the hydrophobic group such as a t-butylethyl group to a hydrophilic group such as a carboxyl group by the action of the acid, and thereby forming a hydrophilic/hydrophobic graft polymer pattern on the surface. Regarding this method, conventional methods such as those disclosed, for example, in JP-A No. 2003-114525 may be used. Moreover, functional groups disclosed in JP-A No. 2001-117223 are useful. Furthermore, an approach which includes forming a graft polymer having a hydrophilic functional group such as (meth)acryloyloxyalkyl trimethyl ammonium and then structurally changing the group to a hydrophobic group by the action of heat can also be used.

[Insulating Substrate]

The insulating substrate for use in the multi-layer circuit board of the invention may be any insulating substrate on which a circuit can be formed and which is suitable for grafting reaction. Examples thereof include glass substrates and organic macromolecular films (hereinafter, referred to as macromolecular films). In addition, a composite plate which includes a resin material and an inorganic filler incorporated in the resin material, or a substrate, sheet or film (flexible substrate) obtained by bonding base materials, such as cloth and paper made of inorganic fibers (e.g., glass fibers), or organic fibers (e.g., polyester, polyamide or cotton fibers), with a resin may also be suitably employed as the substrate.

The substrate suitable for grafting reaction refers to a substrate having a surface on which a radical can be generated by irradiation of radiation such as UV rays or electron beams. A macromolecular film, an inorganic substrate, such as a glass substrate having a surface to which a radical generating agent has been bonded or a ceramic substrate, may be employed as such a substrate. In addition, the substrate can be obtained by forming a primer layer of a composition containing a radical generating agent on the surface of a base substrate by application. Moreover, a radical site may be incorporated into the inside of a base substrate, or the surface of a base substrate may have a radical generating site.

Although the surface smoothness of the substrate is not particularly restricted, the Rz value (ten-point mean height stipulated in JIS B0601) of the substrate is preferably 3 μm or less, and more preferably 1 μm or less. When the surface smoothness of the substrate is within the above range, in other words, the surface is substantially free from unevenness, it is possible to form even an extremely fine wiring (for example, a circuit pattern having a width of each line of 25 μm and a width of each space of 25 μm or less) at a high accuracy without being influenced by the surface roughness of the substrate. That is, it is possible to produce a circuit board having a circuit formed at a high density and high accuracy.

If needed, the substrate may be subjected to conventional surface treatment, such as corona discharge treatment, plasma treatment, flame treatment, and/or heat treatment, for the purpose of improving the adhesion at the time that a radical generating agent is bonded to the substrate surface or at the time that a primer layer of a composition containing a radical generating agent is formed on the substrate by application.

A macromolecular film is particularly preferably employed as the substrate. The type of the macromolecular film is not particularly restricted. Examples of the macromolecular film include epoxy resin films, phenolic resin films, polyimide resin films, unsaturated polyester resin films, polyester resin films, polyphenylene ether resin films, polyphenylene sulfur resin films, polyamide resin films, cyanate ester resin films, benzocyclobutene films and liquid crystal polymer films. Among these, polyimide resin films, such as polyimide films and films including a polyimide component and an appropriate comonomer component incorporated in the polyimide component, are particularly preferred from the viewpoints of dimensional stability, heat resistance and electrical insulating properties.

The polyimide resin film, which is particularly suitable as the aforementioned maclomolecular film, will be explained in more detail below. For the production of the polyimide resin film, a known method may be used. One kind of or at least two kinds of tetracarboxylic dianhydride component and one kind of or at least two kinds of diamine component, whose mole number is substantially the same as the mole number of the tetracarboxylic dianhydride, are polymerized in an organic polar solvent (e.g., N,N'-dimethylformamide) to prepare a polyamic acid polymer solution, which is then cast on a support such as a glass plate or a stainless belt. Thereafter, a polyamic acid film obtained by being partially imidized or partially dried so as to have self-supportability (hereinafter, referred to as gel film) is peeled from the support. While being fixed at its edge with a means, such as a pin or a clip, the film is heated so that polyamic acid is completely imidized. Thus, the above-mentioned polyimide resin film is obtained.

As the tetracarboxylic dianhydride component for use in the production of the polyamic acid polymer, known one may be used. Specific examples thereof include aromatic tetracarboxylic dianhydrides such as pyromellitic dianhydride, 3,3',4,4'-benzophenonetetracarboxylic dianhydride, 3,3',4,4'-diphenylsulfonetetracarboxylic dianhydride, 1,4,5,8-naphthalenetetracarboxylic dianhydride, 2,3,6,7-naphthalenetetracarboxylic dianhydride, 4,4'-oxydiphthalic anhydride, 3,3',4,4'-dimethyldiphenylsilane tetracarboxylic dianhydride, 3,3',4,4'-tetraphenylsilane carboxylic dianhydride, 1,2,3,4-furantetracarboxylic dianhydride, 4,4'-bis(3,4-dicarboxyphenoxy)diphenylpropane dianhydride, 4,4'-hexafluoroisopropylidene diphthalic anhydride, 3,3',4,4'-biphenyltetracarboxylic dianhydride, 2,3,3',4'-biphenyltetracarboxylic dianhydride, and p-phenylenediphthalic anhydride, and p-phenylenebis(trimellitic acid monoester anhydride).

On the other hand, as typical one of the diamine component for use in the production of the polyamic acid polymer, known diamine may be used. Specific examples thereof include aromatic diamines such as 4,4'-diaminodiphenyl ether, 3,4'-diaminodiphenyl ether, 2,2-bis(4-aminophenoxyphenyl)propane, 1,4-bis(4-aminophenoxy)benzene, 1,3-bis(4-aminophenoxy)benzene, 1,3-bis(3-aminophenoxy)benzene, bis(4-(4-aminophenoxy)phenyl)sulfone, bis(4-(3-aminophenoxy)phenyl)sulfone, 4,4'-bis(4-aminophenoxy)biphenyl, 2,2-bis(4-aminophenoxyphenyl)hexafluoropropane, 4,4'-diaminodiphenylsulfone, 3,3'-diaminodiphenylsulfone, 9,9-bis(4-aminophenyl)fluorene, bisaminophenoxy ketone, 4,4'-(1,4-phenylenebis(1-methylethylidene))bisaniline, 4,4'-(1,3-phenylenebis (1-methylethylidene))bisaniline, m-phenylenediamine, p-phenylenediamine, 4,4'-diaminobenzanilide, 3,3'-dimethyl-4,4'-diaminobiphenyl, 3,3'-dimethoxy-4,4'-diaminobiphenyl, 3,3'-dimethylbenzidine and 3,3'-dihydroxybenzidine; and aliphatic diamines.

It should be noted that the combinations of the tetracarboxylic dianhydride components and the diamine components described above are specific examples to obtain polyimide resin films used in the invention and that the invention is not limited by these combinations and that it is possible to adjust the characteristics of polyimide resin films by changing the combination and the ratio of the tetracarboxylic dianhydride component and the diamine component to be used. It is also possible to produce a polyimide resin film by using an appropriate comonomer in addition to the tetracarboxylic dianhydride component and the diamine component.

The thickness of the polyimide resin film is not particularly limited, but it is preferably within the range of from 5 μm to 125 μm and more preferably, particularly for multi-layer printed circuit board applications, from 5 μm to 50 μm. The tensile modulus of the film is not particularly limited, but it is preferably 4 GPa or more, and more preferably 8 GPa or more. The linear expansion coefficient of the film is not particularly limited, but it is preferably 17 ppm or less, and more preferably 10 ppm or less. The water absorption of the film is preferably 2% or less, and more preferably 1% or less. When the polyimide resin film has a tensile modulus, a linear expansion coefficient and water absorption within the above ranges, the resulting circuit board has particularly preferable characteristics.

If needed, the polyimide resin film obtained by the above-mentioned method may be subjected to conventional surface treatment or post treatment. Specifically, embossing, sand blasting, corona discharge treatment, plasma discharge treatment, electron beam irradiation, UV treatment, heat treatment, flame treatment, solvent washing, primer treatment, chemical etching and/or coupling agent treatment may be applied. It is possible to subject the above-mentioned film to one or at least two of the above-mentioned treatments to obtain a polyimide resin film.

(b) Step of Forming, in a Pattern, Second Electrically Conductive Pattern Correspondingly to Graft Polymer Pattern <Electrically Conductive Pattern Formation Step>

<Method of Attaching Electrically Conductive Particles to Graft Polymer Pattern>

Next, a method of forming an electrically conductive pattern on the graft polymer pattern thus obtained will be explained. In the mechanism of the pattern formation applied to the multi-layer circuit board of the invention, an electrically conductive material attaches to a graft polymer depending on the polarity of the electrically conductive material is opposite to the polarity of the graft polymer. That is, a positively charged electrically conductive material attaches to a negatively charged polymer such as an acrylic acid graft polymer. The electrically conductive material may be either a metal or an organic material. The following are examples thereof.

Electrically Conductive Material

The electrically conductive particles used in the invention can be any ones having electrical conductivity. Particles of any known electrically conductive material can be selected and used. Preferable examples thereof include particles of metals such as Au, Ag, Pt, Cu, Rh, Pd, Al and Cr; particles of oxide semiconductors such as $In_2O_3$, $SnO_2$, ZnO, CdO, $TiO_2$, $CdIn_2O_4$, $Cd_2SnO_2$, $Zn_2SnO_4$ and $In_2O_3$—ZnO; particles in which any of the above-mentioned materials is doped with an impurity suitable for the material; particles of spinel compounds such as MgInO and CaGaO; particles of electrically conductive nitrides such as TiN, ZrN and HfN; particles of electrically conductive borides such as $LaB$; and, among organic materials, electrically conductive high polymer particles.

Cationic electrically conductive particles to be used with a negatively charged graft polymer pattern may be positively charged particles of a metal (oxide).

Particles having positive charges at a high density on the surface thereof can be prepared, for example, in accordance with methods proposed by Tohru Yonezawa et al., namely, methods disclosed in T. Yonezawa, Chemistry Letters, 1999, page 1061, T. Yonezawa, Langmuir 2000, Vol. 16, 5218 and Tohru Yonezawa, Polymer Preprints, Japan, Vol. 49, 2911 (2000). Yonezawa et al. show that it is possible to chemically modify the surfaces of metal particles at a high density with a positively charged functional group by utilizing a metal-sulfur bond.

In other electrically conductive pattern formation mechanisms, for example, in a cationic graft polymer pattern forming layer disclosed in JP-A No. 10-296895 and containing, for-example, an ammonium group, the material of the pattern forming layer intrinsically has a positive charge on the surface thereof. The cationic graft polymer pattern adsorbs negatively charged electrically conductive particles to form an electrically conductive region. When such a pattern formation mechanism is used, the electrically conductive particles are preferably metal particles having a surface modified with a negatively charged compound such as citric acid.

<Metal Reduction Method>

In the pattern formation mechanism of an electrically conductive pattern material in this embodiment, a method can be adopted in which a graft polymer pattern is made to adsorb metal ions and the ions are reduced to obtain a metal. A negatively charged region adsorbs metal ions due to its ion adsorptivity and the metal ions adsorbed are then reduced. Thus, simple substance of metal deposits on the region to form a thin metal film. On the other hand, a positively charged region is impregnated with a solution containing a metal salt or a solution in which a metal salt is dissolved, and the metal ions contained in the solution or the metal ions in the metal salt are reduced. Thus, simple substance of metal deposits on the region to form a thin metal film. As a result, a metal circuit is formed.

Moreover, it is possible to deposit an electrically conductive metal such as copper, nickel or gold in a pattern on the deposited thin metal film by, for example, electroplating. This can increase the thickness of the metal pattern to improve the electric conductivity of the pattern. In addition, this can also prevent chemical corrosion of the metal pattern or increase the mechanical strength of the metal pattern.

In another method for providing an electrically conductive material, metal ions are adhered to a graft polymer, and reduced to obtain metal, thereby obtaining electric conductivity.

<Metal Ion and Metal Salt>

Next, metal ions and metal salts will be explained.

In the invention, the metal salt may be any one which is dissolved in a suitable solvent and which is dissociated into a metal ion and a base (anion) to enable application of the metal salt to a hydrophilic surface. Examples thereof include $M(NO_3)_n$, $MCl_n$, $M_{2/n}(SO_4)$ and $M_{3/n}(PO_4)$ wherein M denotes an arbitrary n-valent metal atom suitable for applications described later.

The metal ions usable in the invention can be those resulting from the dissociation of the above-mentioned metal salts. Specific examples thereof include Ag, Cu, Al, Ni, Co, Fe and Pd ions. Ag ions are preferably used in an electrically conductive film, Co ions are preferably used in a magnetic film, and Pd ions are preferably used in a hydrogen-permeable film.

When a method in which metal ions are adsorbed to the graft polymer region that contains a compound having an acidic group is used for applying metal ions or a metal salt to a hydrophilic region, the above-mentioned metal salt can be dissolved in an appropriate solvent, followed either by applying the resultant solution containing dissociated metal ions to a substrate surface on which the graft polymer region is present or by immersing a substrate having the graft polymer region in the solution. When the metal ion-containing solution is brought into contact with the substrate, the acidic group can ionically adsorb metal ions. From the viewpoint of sufficient adsorption, the concentration of the metal ions or the metal salt in the solution to be brought into contact with the substrate is preferably within the range of from 1 to 50% by mass, and more preferably within the range of from 10 to 30% by mass. The contact time is preferably from about 1 hour to about 24 hours.

[Reducing Agent]

In the invention, the reducing agent used to reduce the metal salt or metal ions present in the hydrophilic region after the adsorption or the immersion and to form a thin metal film, is not particularly limited as long as it has the property of reducing the metal salt compound to deposit the metal. For example, the reducing agent may be hypophosphite, tetrahydroborate or hydrazine.

The reducing agent may be properly selected depending on the type of the metal salt or ion used. For example, when an aqueous solution of silver nitrate is used as an aqueous metal salt solution for supplying metal ions or a metal salt, the reducing agent is preferably sodium tetrahydroborate. When an aqueous solution of palladium dichloride is used, the reducing agent is preferably hydrazine.

A method of adding the reducing agent may be a method including providing metal ions or a metal salt to the surface of a substrate on which a hydrophilic region is present, washing the substrate with water to remove excess metal salt or metal ions, immersing the substrate having the surface in water such as deionized water, and adding a reducing agent to the water; or a method in which an aqueous reducing agent solution having a predetermined concentration is directly applied to or dripped on a substrate surface. The addition amount of the reducing agent is preferably excessive to that of the metal ions, namely equal to or greater than equivalent, and is more preferably at least ten times as great as equivalent.

The presence of a uniform metal film having high strength due to the addition of the reducing agent can be confirmed with naked eyes by checking whether the surface has metallic luster. The structure of the film can be confirmed by observing the surface with a transmission electron microscope or an atomic force microscope (AFM). The thickness of the thin metal film can be easily measured in accordance with an ordinary method, for example, a method in which the thickness of a cut surface of the film is measured with an electron microscope.

(c) Step of Forming Hole in Insulating Material Layer (Via Hole Formation Step)

Next, the method of forming a hole (via hole) in the insulating material layer will be explained. Examples of the processing method include methods using a drilling machine, a dry plasma device, a carbon dioxide gas laser, a UV laser or an excimer laser. In particular, methods using a UV-YAG laser or an excimer laser are preferred because they can produce a via hole having a small diameter and a good shape. When a via hole is formed by decomposition caused by laser heating as in a method using a carbon dioxide gas laser or the like, it is preferable to conduct desmear treatment. The desmear treatment makes it easy to form an electrically conductive layer inside the via hole in a post-step.

(d) Step of Introducing Electrically Conductive Material into Hole

In this step, an electrically conducting path which electrically connects the second and first electrically conductive patterns is formed by introducing an electrically conductive material into the hole (via hole) formed in step (c) to obtain electric conductivity. Specific examples of the electrically conductive material include metal materials such as simple substances of copper, nickel, chromium, titanium, aluminum, molybdenum, tungsten, zinc, tin, indium, gold and silver and alloys thereof (e.g., nichrome); electrically conductive macromolecular materials such as polypyrrole and polythiophene; and non-metallic electrically conductive inorganic materials such as graphite and electrically conductive ceramics.

The method of introducing an electrically conductive material into the via hole may be electroless plating or coating. This is because electroless plating and coating make it possible to relatively uniformly and easily produce an electrical conductive portion even in fine space such as the inner space of a via hole.

For example, when the aforementioned metal material is introduced into the via hole, it is particularly preferable to conduct chemical metal plating (electroless plating) while providing a catalyst inside the via hole. It is preferable that the metal plating and metal plating of the graft polymer surface are carried out simultaneously.

On the other hand, when an electrically conductive macromolecular material is introduced into the via hole, electroless plating or coating is adopted. The electroless plating can be conducted by applying an appropriate oxidizing agent to the inside of the via hole and then immersing the laminate in a solution containing pyrrole or thiophene monomer, e.g., a pyrrole solution. The coating can be conducted by preparing a solution in which an electrically conductive macromolecular material, such as polypyrrole or poly(1,4-dioxythiophene), is dissolved in a solvent and applying the solution to the graft polymer layer and the inner surface of the via hole.

In addition, when a non-metallic electrically conductive inorganic material such as graphite is introduced into the via hole, electroless plating which uses no catalyst is suitably conducted. Hereinafter, graphite plating will be explained as an example of such plating. The graphite plating can be carried out by treating the surfaces in the via hole with a pre-treatment solution and then immersing the laminate in a graphite dispersion liquid. One typical example of a graphite plating solution usable in this process is DIRECT PLATING (registered trademark), which is a graphite plating solution available from Mec Co., Ltd. This graphite plating solution includes a combination of a pretreatment liquid (trade name: MEC S PROCESS SP-6560) and a graphite dispersion liquid (trade name: MEC S PROCESS SP-6601).

[Adhesive Layer]

When a first circuit (first electrically conductive pattern) is formed on an insulating substrate and a circuit board (multi-layer circuit board) is then formed on the first circuit in a build-up manner, an adhesive layer may be provided on the rear side of a second insulating material in order to increase the adhesion between the insulating material layer (or insulating substrate) and the first circuit.

The adhesive layer is made of, for example, a conventional adhesive resin. Any conventional material may be used as long as it has appropriate resin fluidity and can realize strong adhesion. The adhesive layer may be an electrically conductive adhesive layer containing appropriate electrically conductive particles such as fine metal particles.

The type of the adhesive layer is not particularly restricted. Adhesive resins which may be contained in the adhesive layer are classified into the following two typical categories: (A) thermally fusable adhesives containing thermoplastic resins and (B) curable adhesives utilizing curing reaction of a thermosetting resin (thermally-curable resin).

Examples of (A) thermoplastic resins, which impart thermal fusability to an adhesive layer, include polyimide resins, polyamide-imide resins, polyetherimide resins, polyamide resins, polyester resins, polycarbonate resins, polyketone resins, polysulfone resins, polyphenylene ether resins, polyolefin resins, polyphenylene sulfide resins, fluorinated resins, polyarylate resins and liquid crystal polymer resins. These resins may be used alone or in an appropriate combination of two or more of them as the material of the adhesive layer of the laminate used in the invention. In particular, from the viewpoints of excellent heat resistance, electric reliability, adhesive property, workability, flexibility, dimensional stability, dielectric constant and cost performance, it is preferable to contain a thermoplastic polyimide resin in the adhesive layer. The thermoplastic polyimide resin will be explained below.

The thermoplastic polyimide resin can be prepared by polymerizing one or at least two kinds of known acid dianhydride components and one or at least two kinds of known diamine components according to conventional methods (see the descriptions regarding a method for preparing a polyimide resin for substrate 1).

The types of the acid dianhydride component and the diamine component are not particularly restricted. In order to obtain particularly superior thermal fusability of a thermoplastic polyimide resin, it is preferable to use, as the acid dianhydride component(s), one or at least two members selected from the group consisting of 2,2-bis(4-hydroxyphenyl)propane dibenzoate-3,3',4,4'-tetracarboxylic acid dianhydride, 1,2-ethylenebis(trimellitic acid monoester anhydride), 4,4'-hexafluoroisopropylidenediphthalic anhydride, 2,3,3',4'-biphenyltetracarboxylic acid dianhydride, 4,4'-oxydiphthalic acid anhydride, 3,3',4,4'-benzophenonetetracarboxylic acid dianhydride and 4,4'-(4,4'-isopropylidenediphenoxy)bis(phthalic anhydride). Moreover, it is preferable to use, as the diamine component(s), one member or two or more members selected from the group consisting of 1,3-bis(3-aminophenoxy)benzene, 3,3'-dihydroxybenzidine and bis(4-(3-aminophenoxy)phenyl)sulfone.

The type of (B) thermosetting resin, which imparts a thermosetting property to an adhesive layer, is not particularly restricted. Specific examples thereof include bismaleimide resins, bisallylnadiimide resins, phenolic resins, cyanate resins, epoxy resins, acrylic resins, methacrylic resins, triazine resins, hydrosilyl curable resins, allyl curable resins and unsaturated polyester resins. These may be used alone or in an appropriate combination of two or more of them. In particular, from the viewpoints of superior adhesive property, workability, heat resistance, flexibility, dimensional stability, dielectric constant and cost performance, the thermosetting resin is preferably an epoxy resin or a cyanate resin. Besides the thermosetting resins exemplified above, it is possible to employ, as a thermosetting component, a thermosetting macromolecule which has at least one reactive group such as an epoxy group, an allyl group, a vinyl group, an alkoxysilyl group, a hydosilyl group or a hydroxyl group in the side chain or terminal of its macromolecular chain.

Moreover, the thermosetting resin can be mixed with the thermoplastic resin for the purpose of controlling fluidity of the adhesive at the time of heat bonding. The mixing ratio of the both resins is not particularly restricted, but the amount of the thermosetting resin is preferably from 1 to 10,000 parts by weight, and more preferably from 5 to 2,000 parts by weight with respect to 100 parts by weight of the thermoplastic resin. The reason for this is as follows. If the proportion of the thermosetting resin in the mixed resin is too high, the adhesive layer may be brittle. Meanwhile, if the proportion is too low, the adhesive (constituting the adhesive layer) may have decreased fluidity or adhesion.

From the viewpoints of superior adhesion, workability, heat resistance, flexibility, dimensional stability, dielectric constant and cost performance, the mixed resin of the thermoplastic resin and the thermosetting resin preferably includes an epoxy or cyanate resin and the aforementioned polyimide resin.

As a method for forming the adhesive layer, conventionally known methods may be adopted. For example, when the adhesive layer is mainly made of the above-mentioned adhesive resin, preferably adopted are a method in which a solution containing an adhesive resin material is prepared, coated and then dried, a method in which a resin material is melted and the melted resin material is coated, and the like.

[Step of Lamination of Circuit Board]

The multi-layer circuit board of the invention can be produced by the following method for producing a multi-layer circuit board of the invention. Referring to FIG. 1, the method for producing a multi-layer circuit board will be explained step by step. FIGS. 1A to 1I are model diagrams which sequentially illustrate the steps of one embodiment of the method for producing a multi-layer circuit board of the invention.

First, a circuit board 14 having a first circuit layer 12 on an insulating substrate 10 is prepared (see FIG. 1A). The circuit board 14 is, for example, an inner layer substrate having the first circuit layer (inner circuit) 12 on the surface thereof. The type of the inner layer substrate is not particularly limited, and a known laminate plate used in ordinary circuit boards, such as that of glass cloth-epoxy resin, paper-phenolic resin, paper-epoxy resin or glass cloth/glass paper-epoxy resin may be used as the inner layer substrate. Alternatively, a BT substrate impregnated with a bismaleimide-triazine resin or a polyimide film substrate having a polyimide film as base material can also be used.

There is no particular limitation on the method for forming the circuit layer 14. Known methods for producing circuit boards, for example, a subtractive method which includes: laminating a copper foil and the above insulating substrate 10 to prepare a copper-clad laminate and removing an unnecessary portion of the copper foil by etching, and an additive method which includes: forming a circuit on a desired portion of the insulating substrate by electroless plating, may be used. FIG. 1A illustrates an example in which the circuit layer 12 has been formed on one side of the insulating substrate 10. The circuit layer 12, however, may be formed on both sides of the insulating substrate 10 by using a double-sided copper clad laminate.

When a circuit board (multi-layer printed circuit board) is formed by building up, on the circuit substrate 14, an insulating material layer or an electric circuit substrate formed on the insulating material layer, an insulating material layer 16A is laminated on the circuit substrate 14 shown in FIG. 1A. A primer layer 16B useful in forming a graft polymer layer may be formed on the insulating material layer 16A, if necessary (FIG. 1B).

The surface of the circuit layer 14 is, if needed, treated to have suitable adhesion. There is no particular limitation on this treatment. Therefore, known methods can be employed such as a method which includes: forming needle-like crystals of copper oxide on the surface of the circuit layer 14 with an alkaline aqueous solution of sodium hypochlorite, and immersing the resultant needle-like crystals of copper oxide in an aqueous solution of dimethylamineborane to reduce the copper oxide.

A laminate having the circuit substrate 14 and the insulating material layer 16A may be formed by laminating them in accordance with a method which includes making the circuit substrate 14 to face the insulating material layer 16A or a circuit substrate formed on the insulating material layer 16A and heating and/or pressing them. In this lamination step, for example, hydraulic press, vacuum press or vacuum lamination can be conducted. In particular, vacuum press and/or vacuum lamination is preferably conducted, since it can prevent bubbles from being incorporated into the adhesive layer during the lamination and the inner layer circuit 12 can be well embedded in an adhesive layer.

In FIG. 1B, the first circuit 12 is formed on one side of the circuit board 14. The first circuit, however, may be formed on both sides of the circuit board. In this case, the insulating material layer 16A may also be formed on both sides of the circuit board 14. There is no particular limitation on a method for forming this. For example, a method can be used which includes applying a varnish of an insulating resin composition to a support, drying the resultant coating to produce an insulating film adhering to the support, and laminating the film on the circuit board 14. Alternatively, another method can be used which includes directly applying the varnish to one side or both sides of the circuit board 14 having a circuit layer 12 with a curtain coater or a roll coater to thereby form the insulating material layer 16A. In this case, an adhesive layer described in detail infra is preferably formed on one side of the insulating material layer 16A which one side is in contact with the first circuit 12.

When a varnish is applied to the circuit board 14, a general coating method such as bar coating, spin coating or screen printing may be used. When a varnish is applied to the support, a comma coater, a bar coater, a kiss coater, or a roll coater may be used. These coaters are properly used depending on the thickness of the insulating material layer. In any event, there is no particular limitation on each of the coating thickness, and drying conditions after the coating. However, it is preferable that 80% by weight or more of the solvent used in the varnish evaporates. Examples of the support to which the varnish is applied include films of plastics such as PET and metal foils. In the case where the support is peeled away after curing of the varnish, the support is preferably a releasable plastic film. When the support is a metal foil such as a copper foil, it may be used, without being peeled off, for the second circuit layer described later. The insulating film laminated on the support is made to face the surface of the circuit board which surface comes into contact with the circuit layer and is laminated on the circuit board in accordance with a lamination method or by using a press machine. In addition, it is preferable to heat and cure the insulating resin composition layer, if necessary.

A second electrically conductive pattern (second circuit) is formed on the insulating material layer 16A. Thus, a multi-layer circuit board is produced. In this embodiment, a step of forming a hole in the insulating material layer 16A is carried out before graft polymer pattern formation. As shown in FIG. 1C, a hole (via hole) is formed in which an electrically conductive material layer connecting the first circuit with the second circuit is to be formed.

There is no particular limitation on a method for forming a via hole. A method using a laser, or a sand blast method may be employed.

Next, a graft polymer pattern 18 corresponding to a desired circuit pattern is formed on the insulating material layer 16A by exposure (FIG. 1D).

If needed, a primer layer 16B containing a polymerization initiator may be formed on the insulating material layer 16A so that graft reaction proceeds easily. The primer layer is not needed when the insulating material itself has a characteristic to generate radicals.

Next, a graft polymer precursor layer containing a compound having a double bond is formed on the insulating material layer 16A or on the primer layer 16B, which is optionally formed on the insulating material layer, and then irradiated in a pattern with light. Radicals generated by the irradiation from the surface of the insulating material layer or primer layer react with the compound having a double bond which compound is in contact with the surface to start graft polymerization. An unreacted compound having a double bond present in non-irradiated portions is removed by water development after the irradiation, and a surface graft polymer pattern having a graft polymer layer 18 only in exposed regions is formed.

In this embodiment, the graft polymer pattern formation is conducted by irradiating radiation such as light. A polymerizable monomer is brought into contact with the surface of the substrate having the hole, and the substrate is irradiated with light such as UV rays or visible rays, or irradiated with electron rays such as γ-rays to form a graft polymer layer (graft polymer pattern) 18 in a desired pattern. Examples of a light source for use in the pattern formation include a mercury lamp, a metal halide lamp, a xenon lamp, a chemical lamp and a carbon arc lamp. Examples of radioactive rays include electron rays, X-rays and ion beams. In addition, g-rays, i-rays, Deep-UV light, or high density energy beam (laser beam) may also be used. Examples of other applicable light source include gas lasers such as a carbon dioxide laser, a nitrogen laser, an Ar laser, a He/Ne laser, a He/Cd laser and a Kr laser; liquid (dye) lasers; solid lasers such as a ruby laser and an Nd/YAG laser; semiconductor lasers such as a GaAs/GaAlAs laser and an InGaAs laser; and excimer lasers such as a KrF laser, an XeCl laser, an XeF laser and an ArF laser.

An electrically conductive material is attached to the graft polymer pattern 18 to form a second electrically conductive pattern 20. Thereafter, an electrically conductive material is introduced into the via hole by electroless plating in the manner described above. Thus, an electrically conductive path 22 which electrically connects the second electrically conductive pattern 20 with the first electrically conductive pattern 12 is formed and, as a result, a two-layer circuit board is formed (FIG. 1E).

Alternatively, the electrically conductive material can be simultaneously adhered to the pattern and the inside of the via hole in the above-mentioned means, or an electrically conductive material layer can be formed by, for example, electroless plating.

When electrical conductivity is obtained by, for example, plating, it is preferable to moderately roughen the inner surface inside the via hole in some cases. As the roughening solution, an acidic roughening solution such as a chromium/sulfuric acid roughening solution, an alkaline permanganate roughening solution, a sodium fluoride/chromium/sulfuric acid roughening solution, or a borofluoric acid roughening solution may be used. In the roughening treatment, for example, an aqueous solution including diethylene glycol monobutyl ether and NaOH and serving as a swelling liquid is warmed to 70° C. and then the substrate is immersed therein for one minute. Thereafter, an aqueous solution including KMnO and NaOH and serving as a roughening solution is warmed to 80° C. and the substrate is immersed therein for two minutes. Subsequently, the substrate is immersed in a neutralizing solution, e.g., an aqueous hydrochloric acid solution of stannous chloride ($SnCl_2$) at room temperature for five minutes. After the roughening treatment, a plating catalyst applying treatment to adhere palladium to the substrate is conducted. The plating catalyst treatment is conducted by immersing the substrate in a palladium chloride plating catalyst solution. Then, the substrate is immersed in an electroless plating solution to deposit an electroless plating layer (electrically conductive layer) having a thickness of from 0.3 to 1.5 μm on the graft polymer pattern 18 and, when the via hole was formed before this step, also on the inner surface of the via hole. Further electroless plating may be conducted, as necessary, to achieve the required thickness. The electroless plating solution for use in the electroless plating may be a known one, and is not particularly limited. Moreover, the electroplating may be conducted in accordance with any conventional method. Such plating is preferably copper plating.

The second electrically conductive pattern 20 formed according to the above-described production method is a circuit pattern having a width of each line of 10 μm and a width of each space of 10 μm. It was confirmed that it is possible to form a satisfactory circuit free from deterioration in shape.

When a multi-layer circuit board having three or more layers is formed thereafter, a multi-layer circuit board having a three-layer circuit as shown in FIG. 1I, or a circuit board having a circuit with four or more layers can be produced by forming a second insulating material layer 24 on the second electrically conductive pattern 20 and repeating the steps shown in FIGS. 1B to 1E (FIGS. 1G to 1I).

In the method for producing a circuit board of the invention, the second circuit 20 and the third circuit 26, which is optionally provided, are preferably formed on the insulating material layers 16A and 24 each having a smooth surface, respectively. In this case, unlike an electroless plating metal layer formed on the surface of a roughened resin substrate, which is obtained in conventional art, the second and third circuit layers can be formed on smooth surfaces with good adhesiveness. Therefore, the method for producing a very fine electrically conductive pattern of the invention can provide a satisfactory circuit having a shape according to design and having no deterioration in thin lines due to surface unevenness.

One of the characteristics of the method for producing a circuit board of the invention is that it is easy to ensure insulating characteristics during circuit formation. That is, because an electroless copper plating or an electroless copper plating catalyst is attached to the entire surface of an insulating substrate in a conventional semi-additive process, the metal tends to undesirably remain on the substrate. Therefore, the insulating property between lines on the resulting circuit board easily falls. However, in the production method of the invention, an electroless copper plating or an electroless copper plating catalyst is attached to only a pattern necessary for forming a circuit rather than the entire surface of an insulating substrate. Therefore, the above-mentioned problem does not arise in which an electroless copper plating or an electroless copper plating catalyst undesirably remains in portions other than the pattern which portions should be insulative. Accordingly, the method for producing a circuit board of the invention makes it possible to form a high density circuit (wiring) which has strong adhesion to a substrate and superior insulating properties.

EXAMPLES

Hereinafter, the invention will be described in more detail by way of examples with reference to FIG. 1. However, it should be noted that the scope of the invention is not limited by the descriptions for the examples.

Example 1

A polyimide film with a thickness of 12.5 μm (APIKAL HP (trade name) manufactured by Kanegafuchi Chemical Co., Ltd.: insulating material layer 3) was used as an insulating material layer 16A. The surface smoothness of the polyimide film was 0.8 μm in terms of an Rz value. The following photopolymerizable composition to form a primer layer 16B was applied to the polyimide film to form a coating having a thickness of 1 μm. The photopolymerizable composition contained a radical generating agent and, when irradiated with light in a pattern, could generate radicals on the surface thereof.

| Photopolymerizable Composition | |
|---|---|
| Allyl methacrylate/methacrylic acid copolymer (molar ratio of 80/20 and molecular weight of 100,000) | 4 g |
| Ethylene oxide-modified bisphenol A diacrylate (M210 manufactured by Toagosei Co., Ltd.) | 4 g |
| 1-Hydroxycyclohexylphenyl ketone | 1.6 g |
| 1-Methoxy-2-propanol | 16 g |

The photopolymerizable composition was applied with a rod bar #6 and the resultant film was dried at 80° C. for two minutes. The applied film was irradiated with light emitted by a 400 W high-pressure mercury lamp (UVL-400P manufactured by Riko Kagaku Sangyo Co., Ltd.) for five minutes to pre-cure the film. Thus, a primer layer 16B was formed.

Disposing of adhesive layer on lower surface of insulating material layer 16A

The air inside a glass flask with a capacity of 2,000 ml was purged with nitrogen gas and a polar solvent, N,N-dimethylformamide (DMF), was put into the flask. Then, one equivalent amount of bis{4-(3-aminophenoxy)phenyl)sulfone (BAPS-M) was dissolved in the DMF. One equivalent amount of 4,4'-(4,4'-isopropylidenediphenoxy)bis(phthalic anhydride) (BPADA) was added to the resulting solution while cooling the solution in iced water and stirring the solution, whereby a polymerization reaction was carried out. Thus, a polyamic acid polymer solution (polyamic acid solution) with a solid content of 30% by weight was obtained. This polyamic acid solution was heated at 200° C. for 180 minutes under a reduced pressure of 665 Pa to yield a solid thermoplastic polyimide resin. Subsequently, the thermoplastic polyimide resin, a novolak-type epoxy resin (EPIKOTE 1032H60 manufactured by Yuka Shell Co., Ltd.) and 4,4'-diaminodiphenylsulfone (4,4'-DDS) were mixed so that the weight ratio of the polyimide resin, epoxy resin and 4,4'-DDS was 70/30/9. Moreover, the resultant mixture was dissolved in dioxolane so that the solid content of the resultant solution became 20% by weight. Thus, an adhesive solution was obtained. The resulting adhesive solution was applied to one side of the insulating material layer 16A so that the dried thickness of the resultant coating became 9 μm. Then, the coating was dried at 170° C. for two minutes. Thus, an adhesive layer was formed.

An inner layer circuit board 14 was prepared from a glass epoxy copper-clad laminate entirely covered with a copper foil having a thickness of 9 μm. Then, the insulating material layer 16A with the adhesive layer was laminated on the inner layer circuit board 14 under the following vacuum press conditions: a temperature of 200° C., a hot plate pressure of 3 MPa, a press time of 2 hours and a vacuum pressure of 1 KPa. Thus, the adhesive layer was cured.

Subsequently, a via hole with an inner diameter of 30 μm that reached the electrode 12 was formed right above an electrode 12 of the inner layer circuit board 14 by means of a UV-YAG laser.

Application of Double-Bond Compound

A graft polymer precursor layer with a thickness of 2 μm was formed by applying an aqueous solution containing, as a double-bond compound, a polymer having an acrylic group and a carboxyl group (P-1) (the preparation thereof is shown below) to the surface of the substrate in which the via hole had been formed (FIG. 1C) with a rod bar #6 and drying the resultant coating at 100° C. for one minute.

Compound Having Polymerizable Group (Application of Graft Precursor Polymer)

| Coating Liquid Composition 1 | |
|---|---|
| Hydrophilic polymer having a polymerizable group at side chains (P-1) | 3.1 g |
| Water | 24.6 g |
| 1-Methoxy-2-propanol | 12.3 g |

Synthesis of Compound Having Polymerizable Group, Hydrophilic Polymer (P-1)

Eighteen grams of polyacrylic acid (average molecular weight of 25000) was dissolved in 300 g of dimethylacetamide (DMAC), and 0.41 g of hydroquinone, 19.4 g of 2-methacryloyloxyethyl isocyanate and 0.25 g of dibutyltin dilaurate were added to the resultant solution, and the resultant mixture was reacted at 65° C. for 4 hours. The acid value of the polymer obtained was 7.02 meq/g. Then, the carboxylic group of the polymer was neutralized with a 1 mol/l (1N) sodium hydroxide aqueous solution, and ethyl acetate was added to the reaction system to precipitate the polymer, and the polymer was thoroughly washed. Thus, 18.4 g of a hydrophilic polymer (P-1) having a polymerizable group at side chains thereof was obtained.

Formation of Graft Polymer Pattern by Exposure

Energy was imagewise applied to the thus-obtained substrate under the conditions shown below to form a graft polymer layer 18 only in exposed portions. Thus, a hydrophilic/hydrophobic pattern-formed material A was obtained which had regions where the graft polymer was formed and regions where no graft polymer was formed.

The energy application was conducted by imagewise irradiating with a 400 W high-pressure mercury lamp (UVL-400P manufactured by Riko Kagaku Sangyo Co., Ltd.) for 5 minutes under an argon atmosphere. After the irradiation, the substrate was thoroughly washed with deionized water.

Adhesion of Electrically Conductive Material to Graft Polymer Pattern

The graft polymer pattern material A was immersed in a 0.1% by mass aqueous solution of palladium nitrate (manufactured by Wako Pure Chemical Industries, Ltd.) for one hour and was then washed with distilled water. Thereafter, it was immersed in an electroless plating bath containing the following composition for 20 minutes to form a metal pattern A20.

| Electroless Plating Bath Components | |
|---|---|
| OPC COPPER H T 1 (manufactured by Okuno Chemical Industries Co., Ltd.) | 6 mL |
| OPC COPPER H T 2 (manufactured by Okuno Chemical Industries Co., Ltd.) | 1.2 mL |
| OPC COPPER H T 3 (manufactured by Okuno Chemical Industries Co., Ltd.) | 10 mL |
| Water | 83 mL |

Subsequently, the metal pattern A20 was immersed in an electroplating bath containing the following composition and application of an electric current was conducted for 15 minutes. Thus, a copper circuit with electroplating having a thickness of 15 µm was obtained. The current density during the plating was 2 A/dm².

| Composition in Electroplating Bath | |
|---|---|
| Copper sulfate | 38 g |
| Sulfuric acid | 95 g |
| Hydrochloric acid | 1 mL |
| COPPER GLEAM PCM (manufactured by Meltex Inc.) | 3 mL |
| Water | 500 g |

The resulting pattern was observed with an optical microscope, and the pattern had lines and spaces each having a width of 10 µm and formed in a straight line form. In regions where no graft polymer was present, deposition of metal was not found at all. In addition, the presence of metal in regions where no graft polymer was present was checked with EPMA, and the presence of remaining metal was not found at all in the regions where no graft polymer was present.

Moreover, the peel strength (JIS C6471) between the circuit 12 (electro-copper plating circuit) and the second circuit layer 20 shown in FIG. 1 was 20 N/cm, which exhibited strong adhesion. The peel strength hardly deteriorated even after a standard accelerated heat resistance test (Build-Up Circuit Board Technical Standards, JPCA Standards, ver. 2; 150° C., 500 hours), and the peel strength after the test was 18 N/cm.

On the other hand, the peel strength (JIS C6471) in the case where electro-copper plating was formed on an electroless copper plating layer (Conventional case) was 10 N/cm and the peel strength after the standard accelerated heat resistance test was 5 N/cm. In comparison with the above conventional case, it is found that strong adhesion between the insulating material layer 16A and the circuit 12 or the circuit 20 can be realized by the method for producing a circuit board of the invention.

Example 2

A polyimide film with a thickness of 12.5 µm (APIKAL HP manufactured by Kanegafuchi Chemical Co., Ltd.) was used as an insulating material. In the same manner as in Example 1, a primer layer and an adhesive layer were formed on the film, and the resultant was adhered to a first circuit, and a via hole was formed. Next, a graft polymer precursor layer with a thickness of 2 µm was formed by applying an aqueous solution containing, as a double-bond compound, a polymer having an acrylic group and a carboxyl group (P-2) (the preparation thereof is shown below) with a rod bar #6 and drying the resultant coating at 100° C. for one minute.

Composition of Coating Liquid
Polymerizable group-containing polymer (P-2) (the preparation method thereof is shown below) 4.5 g
Ethanol 23 g Method for Preparing Polymerizable Group-Containing Polymer P-2

58.6 g of 2-hydroxyethyl methacrylate was put in a 500 ml three-neck flask, and 250 ml of acetone were added thereto and stirred. After addition of 39.2 g of pyridine and 0.1 g of p-methoxyphenol, the resultant mixture was cooled in an ice bath containing iced water. After the temperature of the mixture reached 5° C. or lower, 114.9 g of 2-bromoisobutanoyl bromide was dripped from a dropping funnel to the mixture, which was being stirred, over three hours. After completion of the dripping, the ice bath was removed and the mixture was stirred for three hours. The reaction mixture was poured into 750 ml of water and the resultant mixture was stirred for one hour. The product contained in the water mixture was extracted three times with 500-ml ethyl acetate, using a separatory funnel. The resultant organic layer was sequentially washed with 500 ml of 1M hydrochloric acid, 500 ml of saturated aqueous solution of sodium hydrogen carbonate, and 500 ml of saturated brine. The organic layer was dehydrated and dried with 100 g of magnesium sulfate and then filtered. The solvent of the organic layer was distilled off under a reduced pressure. Thus, 120.3 g of monomer A was obtained.

Then, 40 g of N,N-dimethylacetamide was put in a 1,000 ml three-neck flask, and was heated to 70° C. under nitrogen flow. 12.58 g of monomer A, 27.52 g of methacrylic acid and a solution in which 0.921 g of V-601 (manufactured by Wako Pure Chemical Industries, Ltd.) was dissolved in 40 g of N,N-dimethylacetamide were dripped into the content of the flask, which was being stirred, over 2.5 hours. After completion of the dripping, the resultant mixture was heated to 90° C. and stirred for two hours. The reaction solution was cooled to room temperature and then poured into 3.5 L of water to precipitate a macromolecular compound. The macromolecular compound precipitated was collected by filtration, washed with water and then dried. Thus, 30.5 g of macromolecular compound was obtained. The weight-average molecular weight of the resulting macromolecular compound was measured by gel permeation chromatography (GPC) using polystyrene as a standard substance and found to be 124,000.

26.0 g of the resulting macromolecular compound and 0.1 g of p-methoxyphenol were put in a 200 ml three-neck flask, and were dissolved in a mixture of 60 g of N,N-dimethylacetamide and 60 g of acetone. The resultant solution was cooled in an ice bath containing iced water. After the temperature of the mixed solution reached 5° C. or lower, 60.4 g of 1,8-diazabicyclo[5.4.0]-7-undecene (DBU) was dripped from a dropping funnel to the flask, whose content was being stirred, over one hour. After completion of the dripping, the ice bath was removed and the resultant mixture was stirred for eight hours. The reaction solution was poured into 2 L of water containing 17 ml of concentrated hydrochloric acid dissolved therein to precipitate a polymerizable group-containing polymer. The polymerizable group-containing polymer P-2 precipitated was collected by filtration, washed with water and then dried. Thus, 15.6 g of P-2 was obtained.

Next, the graft polymer precursor layer was subjected to pattern exposure with a 1.5 kW high-pressure mercury lamp for one minute in the same manner as in Example 1. Then, the resulting film was washed with an aqueous solution of saturated sodium bicarbonate to prepare a graft polymer pattern material having a graft polymer pattern in which exposed portions were changed to hydrophilic portions.

Adsorption of Gold Particles to Pattern (Adhesion of Electrically Conductive Material)

The substrate having thereon the graft polymer pattern was immersed in an electrically conductive material dispersion liquid (positively charged Ag dispersion) prepared in the manner described below. Thereafter, the surface was washed fully with running water so that excess Ag dispersion liquid was removed. Thus, an electrically conductive pattern material 1 to which the electrically conductive material had adhered in a pattern was obtained.

Method of Synthesizing Conductive Material

Three grams of bis(1,1-trimethylammoniumdecanoylaminoethyl)disulfide was added to 50 ml of 5 mM ethanol solution of silver perchlorate, and then 30 ml of 0.4 M sodium boron hydride was slowly dripped into the resultant mixture, which was being vigorously stirred, to reduce the silver ions, whereby a dispersion liquid including silver particles coated with quaternary ammonium was obtained. The average particle diameter of the silver particles as determined under an electron microscope was 5 nm.

An electrically conductive pattern was formed on this pattern under the same conditions as those of the electroplating conducted in Example 1.

The resulting pattern was observed under an optical microscope, and the pattern had lines and spaces each having a width of 10 μm and formed in a straight line form. In regions where no graft polymer was present, precipitation of metal was not found at all. In addition, the presence of metal in regions where no graft polymer was present was checked with EPMA. The presence of remaining metal was not found at all in the regions where no graft polymer was present.

Moreover, the peel strength (JIS C6471) between the circuit 18 or 20 (electro-copper plating circuit) and the first circuit layer 12 shown in FIG. 1 was 22 N/cm, which exhibited strong adhesion. The peel strength hardly deteriorated even after a standard accelerated heat resistance test (Build-Up Circuit Board Technical Standards, JPCA Standards, ver. 2; 150° C., 500 hours), and the peel strength after the test was 20 N/cm.

On the other hand, the peel strength (JIS C6471) in the case where electro-copper plating was formed on an electroless copper plating layer (Conventional case) was 10 N/cm and the peel strength after the standard accelerated heat resistance test was 5 N/cm. In comparison with the above conventional case, it is found that strong adhesion between the insulating material layer 16A and the first circuit 12 (electrically conductive pattern) or the second circuit 20 (electrically conductive pattern) can be realized by the method for producing a circuit board according to the invention.

Figure 1A:
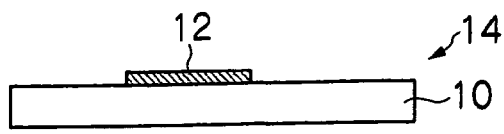
FIG. 1A is a cross-sectional view which schematically illustrates a step included in an embodiment of a method for producing a multi-layer circuit board of the invention.
Figure 1B:
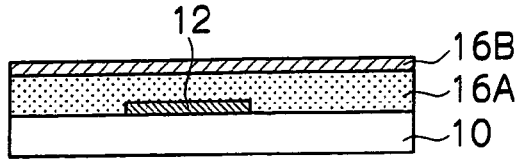
FIG. 1B is a cross-sectional view which schematically illustrates a step included in an embodiment of a method for producing a multi-layer circuit board of the invention.
Figure 1C:
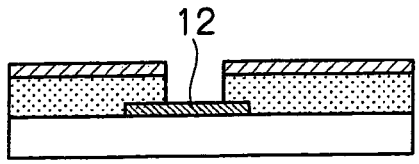
FIG. 1C is a cross-sectional view which schematically illustrates a step included in an embodiment of a method for producing a multi-layer circuit board of the invention.
Figure 1D:
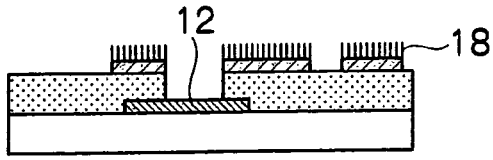
FIG. 1D is a cross-sectional view which schematically illustrates a step included in an embodiment of a method for producing a multi-layer circuit board of the invention.
Figure 1E:
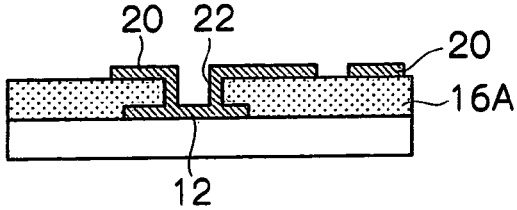
FIG. 1E is a cross-sectional view which schematically illustrates a step included in an embodiment of a method for producing a multi-layer circuit board of the invention.
Figure 1F:
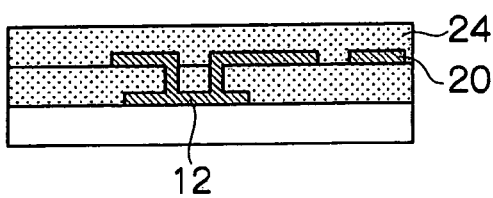
FIG. 1F is a cross-sectional view which schematically illustrates a step included in an embodiment of a method for producing a multi-layer circuit board of the invention.
Figure 1G:
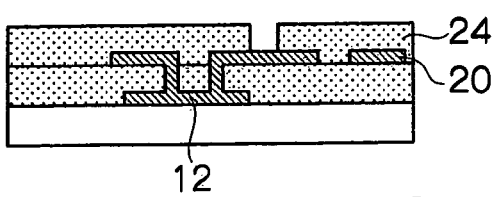
FIG. 1G is a cross-sectional view which schematically illustrates a step included in an embodiment of a method for producing a multi-layer circuit board of the invention.
Figure 1H:
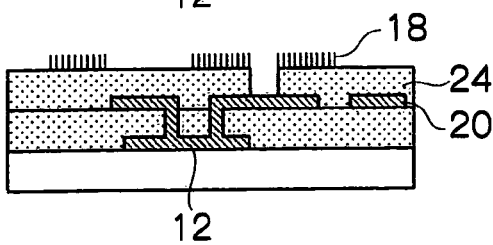
FIG. 1H is a cross-sectional view which schematically illustrates a step included in an embodiment of a method for producing a multi-layer circuit board of the invention.
Figure 1I:
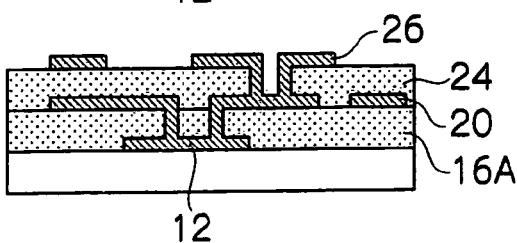
FIG. 1I is a cross-sectional view which schematically illustrates a step included in an embodiment of a method for producing a multi-layer circuit board of the invention.

What is claimed is:

1. A method for producing a multi-layer circuit board, the method comprising (a) a step of forming a surface-grafted polymer pattern on an insulating material layer of a laminate having a first electrically conductive pattern which is arbitrarily formed on an insulating substrate and the insulating material layer, (b) a step of forming a second electrically conductive pattern on the surface-grafted polymer pattern, (c) a step of forming a hole in the insulating material layer, and (d) a step of introducing an electrically conductive material into the hole to form an electrically conductive path which electrically connects the second electrically conductive pattern and the first electrically conductive pattern.

2. The method for producing a multi-layer circuit board of claim 1, wherein the surface-grafted polymer pattern formed on the insulating material layer in step (a) comprises a region where a surface-grafted polymer is present and a region where no surface-grafted polymer is present, and step (b) comprises providing an electrically conductive material selectively in one of the regions.

3. The method for producing a multi-layer circuit board of claim 1, wherein the surface-grafted polymer pattern formed on the insulating material layer in step (a) comprises a region where a hydrophilic surface-grafted polymer is present and a region where a hydrophobic surface-grafted polymer is present, and step (b) comprises providing an electrically conductive material selectively in one of the regions.

4. The method for producing a multi-layer circuit board of claim 1, wherein the insulating substrate has a mean roughness (Rz), as measured by a ten-point mean height method in accordance with JIS B0601 (1994), of 3 μm or less.

5. The method for producing a multi-layer circuit board of claim 2, wherein the insulating substrate has a mean roughness (Rz), as measured by a ten-point mean height method in accordance with JIS B0601 (1994), of 3 μm or less.

6. The method for producing a multi-layer circuit board of claim 3, wherein the insulating substrate has a mean roughness (Rz), as measured by a ten-point mean height method in accordance with JIS B0601 (1994), of 3 μm or less.

7. The method for producing a multi-layer circuit board of claim 1, wherein the surface-grafted polymer pattern formed on the insulating material layer comprises a surface-grafted polymer which has a functional group capable of interacting with an electrically conductive material.

8. The method for producing a multi-layer circuit board of claim 7, wherein the functional group capable of interacting with an electrically conductive material is selected from the group consisting of a carboxyl group, a hydroxyl group, an amino group, a sulfonate group, a phosphonate group and an amido group.

* * * * *